United States Patent
Ahn et al.

(10) Patent No.: US 6,660,587 B2
(45) Date of Patent: Dec. 9, 2003

(54) METHOD FOR FORMING A GATE ELECTRODE IN A SEMICONDUCTOR DEVICE

(75) Inventors: Jae-Young Ahn, Seongnam-si (KR); Bong-Hyun Kim, Gwangyeok-si (KR); Jae-Duk Lee, Suwon-si (KR); Man-Sug Kang, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/205,987

(22) Filed: Jul. 26, 2002

(65) Prior Publication Data

US 2003/0022488 A1 Jan. 30, 2003

(30) Foreign Application Priority Data

Jul. 28, 2001 (KR) ........................................ 2001-45753

(51) Int. Cl.$^7$ ............................................. H01L 21/336
(52) U.S. Cl. ........................ 438/257; 438/259; 438/265; 438/266
(58) Field of Search ................................. 438/257, 258, 438/259, 260, 261, 262, 263, 264, 265, 266; 257/314, 315, 316, 317, 318, 320, 321

(56) References Cited

U.S. PATENT DOCUMENTS 4,830,974 A * 5/1989 Chang et al. ................ 438/201
6,063,698 A    5/2000 Tseng et al. ................ 438/585

* cited by examiner

Primary Examiner—Jack Chen
(74) Attorney, Agent, or Firm—F. Chau & Associates, LLC

(57) ABSTRACT

A semiconductor device and method of production are disclosed, the method including forming a preliminary gate electrode on a semiconductor substrate, the preliminary gate electrode including a gate oxide layer pattern and a conductive layer pattern stacked on the gate oxide layer pattern, and performing a re-oxidation process for curing damage of the semiconductor substrate and/or a sidewall of the conductive layer pattern, when the preliminary gate electrode is formed by forming an oxide layer on an outer surface of the preliminary gate electrode and on the semiconductor substrate, by supplying an oxygen gas and a chlorine-including gas while restraining a thickness of the gate oxide layer pattern from being increased; and the semiconductor device comprising a preliminary gate electrode formed on a semiconductor substrate, the preliminary gate electrode including a gate oxide layer pattern and a conductive layer pattern stacked on the gate oxide layer pattern, and a re-oxidized semiconductor substrate and/or a sidewall of the conductive layer pattern, with damage cured therein by supplying an oxygen gas and a chlorine-including gas while restraining a thickness of the gate oxide layer pattern from being increased.

10 Claims, 12 Drawing Sheets

METHOD FOR FORMING A GATE ELECTRODE IN A SEMICONDUCTOR DEVICE

BACKGROUND OF THE INVENTION

1. Field of the Invention

The present invention relates to a method for forming a gate electrode in a semiconductor device, and more particularly, to a method for forming a gate electrode having a narrow line width.

2. Description of the Related Art

Semiconductor memory devices may be categorized as random access memory ("RAM") devices and read only memory ("ROM") devices. Generally, the RAM devices, such as dynamic random access memory ("DRAM") devices and static random access memory ("SRAM") devices, are volatile devices that lose data after a lapse of time. The data processing time for RAM devices, such as for input and/or output of data, is generally very fast. In contrast, ROM devices can generally maintain data indefinitely, but the data processing time for ROM devices is relatively slow. It is desirable for semiconductor memory devices to have a high degree of integration to form a great number of chips on a semiconductor substrate. Thus, the critical dimension ("CD") of patterns accommodated in the memory devices becomes narrow. One or more transistor gate electrodes are typically included in each cell of a semiconductor memory device. Accordingly, the CD for the gate electrodes of these transistors becomes narrow.

SUMMARY OF THE INVENTION

The present invention addresses the above and other drawbacks and disadvantages of the prior art. Thus, first preferred embodiments of the present invention provide a method for forming a gate electrode of a semiconductor device that is capable of improving a characteristic variation of a cell by restraining the thickness of a gate oxide layer pattern from being increased when a re-oxidation process is carried out for forming the gate electrode.

Second preferred embodiments of the present invention provide a method for forming a cell gate electrode of a non-volatile memory device, capable of improving a characteristic variation of a cell by restraining the thickness of a gate oxide layer pattern and a dielectric interlayer pattern from being increased when a re-oxidation process is carried out for forming the cell gate electrode.

To achieve the first preferred embodiments of present invention, a preliminary gate electrode including a gate oxide layer pattern and a conductive layer pattern stacked on the gate oxide layer pattern is formed on a semiconductor substrate. A re-oxidation process is performed for forming the gate electrode by forming an oxide layer on an outer surface of the preliminary gate electrode and the semiconductor substrate, and supplying an oxygen gas and a chlorine-including gas into a reactor while restraining a thickness of the gate oxide layer pattern from being increased.

To achieve the second preferred embodiments of the present invention, a preliminary cell gate electrode is formed on a semiconductor substrate. The preliminary cell gate electrode includes a tunnel oxide layer pattern, a first conductive layer pattern stacked on the tunnel oxide layer pattern, a dielectric interlayer pattern stacked on the first conductive layer pattern, and a second conductive layer pattern stacked on the dielectric interlayer. A re-oxidation process is performed for forming an oxide layer on an outer surface of the preliminary cell gate electrode and on the semiconductor substrate by supplying an oxygen gas and a chlorine-including gas while restraining a thickness of the tunnel oxide layer pattern and the dielectric interlayer pattern from being increased.

According to another preferred embodiment of the present invention, a stacked structure of a tunnel oxide layer pattern, a first silicon layer pattern for a floating gate, and a nitride layer pattern are formed on a semiconductor substrate. A trench is formed by etching the semiconductor substrate using the stacked structure as an etching mask. A field oxide layer is formed for burying the trench. A dielectric interlayer and a second silicon layer for a control gate are sequentially formed on the first silicon layer pattern. A preliminary cell gate electrode having a stacked structure of the tunnel oxide layer pattern, the first silicon layer pattern, a floating gate pattern, an dielectric interlayer pattern, and the second silicon layer pattern, is formed by etching predetermined portions of the control gate and the dielectric interlayer. A re-oxidation process is performed for forming an oxide layer on an outer surface of the preliminary cell gate electrode and on the semiconductor substrate by supplying an oxygen gas and a chlorine-including gas onto the semiconductor substrate, including the cell gate electrode, while restraining a thickness of the tunnel oxide layer pattern and the dielectric interlayer pattern from being increased.

Since the oxygen gas and the chlorine-including gas are used for the re-oxidation process, the thickness of the gate oxide layer pattern can be restrained from being increased so that the thickness difference of the gate oxide layer pattern in each gate electrode can be reduced.

BRIEF DESCRIPTION OF THE DRAWINGS

The above and other objects and advantages of the present invention will become more apparent by describing in detail preferred embodiments thereof with reference to the attached drawings, in which.

DETAILED DESCRIPTION OF THE PREFERRED EMBODIMENTS

Disclosed is a method for forming a gate electrode, capable of restraining a thickness of a gate oxide layer pattern from being increased when a re-oxidation process is carried out for forming the gate electrode. A preliminary gate electrode including a gate oxide layer pattern and a conductive layer pattern stacked on the gate oxide layer pattern is formed on a semiconductor substrate. A re-oxidation process is performed for forming the gate electrode by forming an oxide layer on an outer surface of the preliminary gate electrode and on the semiconductor substrate with supplying an oxygen gas and a chlorine-including gas into a reactor while restraining a thickness of the gate oxide layer pattern from being increased. Thus, the chlorine-including gas can reduce a length of a Bird's Beak, as known in the art, that occurs when the re-oxidation process is carried out, so a thickness of the gate electrode is retrained from being increased.

Figure 1A:
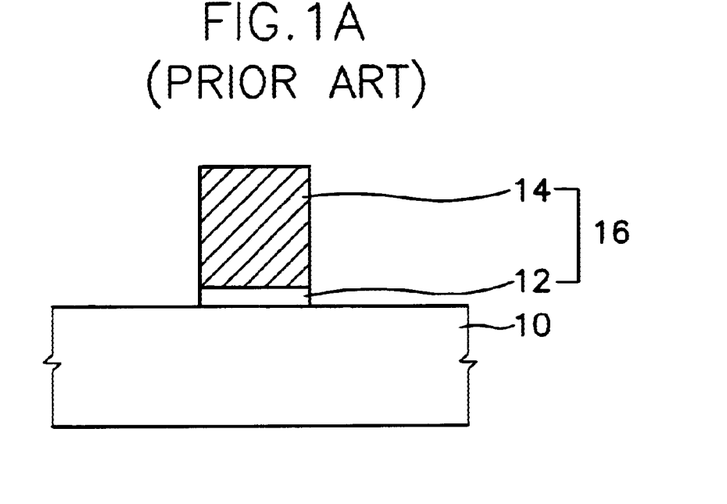
FIGS. 1A and 1B are sectional views showing a conventional method for forming a gate electrode in a semiconductor device.
Figure 1B:
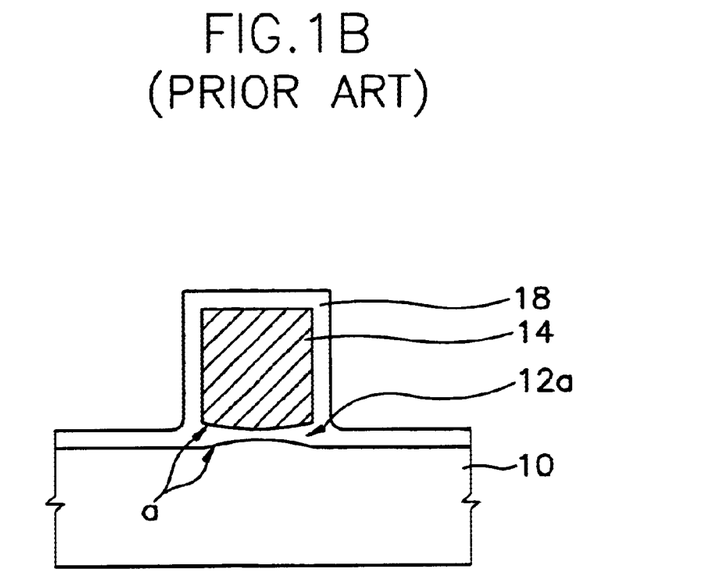

FIGS. 1A and 1B are sectional views showing a conventional method for forming a gate electrode in a semiconductor device. Referring to FIG. 1A, a preliminary gate electrode 16 including an oxide layer pattern 12 and a conductive layer pattern 14 stacked on the oxide layer pattern 12 is formed on a semiconductor substrate 10. Particularly, a gate oxide layer is formed on the semiconductor substrate 10 to a thickness of about 50 to 200 Å. Then, a conductive layer is formed on the gate oxide layer. The conductive layer is formed by depositing polysilicon doped with N-type or P-type impurities.

After forming a photoresist pattern for defining a gate electrode area on the conductive layer, the conductive layer is etched using the photoresist pattern as an etching mask. Then, the photoresist pattern is removed. Plasma ashing, sulfuric acid stripping, and substrate cleaning processes are carried out for removing the photoresist pattern, so the oxide layer exposed to the semiconductor substrate is almost removed. The preliminary gate electrode 16 including the gate oxide layer pattern 12 and the conductive layer pattern 14 stacked on the gate oxide layer pattern 12 is formed through the above processes.

Referring to FIG. 1B, the semiconductor substrate 10 formed with the preliminary gate electrode 16 is subject to a re-oxidation process so as to form an oxide layer 18 on an outer surface of the gate electrode 16 and on the semiconductor substrate 10. The re-oxidation process is carried out to cure the damage of the semiconductor substrate 10 and a sidewall of the preliminary gate electrode 16, caused by an impact of ions having high energy while an etching process for forming the preliminary gate electrode 16 is being carried out.

That is, the semiconductor substrate 10 formed with the preliminary gate electrode 16 is thermally treated in an oxidation atmosphere thereby curing the damage of the semiconductor substrate 10 and the preliminary gate electrode 16. At this time, the oxide layer 18 is formed on the outer surfaces of the preliminary gate electrode 16 and on the semiconductor substrate 10 caused by a reaction between silicon ("Si") and an oxidant.

However, when the re-oxidation process is carried out, the oxidant is diffused into lateral directions of a gate oxide layer pattern 12a, so the "Bird's Beak" as known in the art (referred to as "a" in FIG. 1B) is created at both ends of the gate oxide layer pattern 12a. Due to the Bird's Beak phenomenon, both ends of the gate oxide layer pattern 12a are expanded and a bottom peripheral portion of the conductive layer pattern 14 is bent.

Figure 2A:
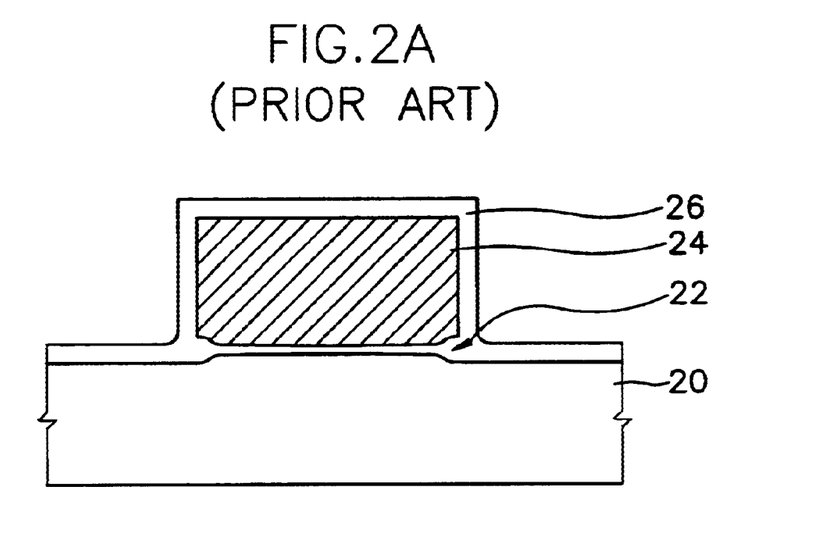
FIGS. 2A and 2B are sectional views showing a relationship between a width of the gate electrode and a thickness of the gate oxide layer pattern.
Figure 2B:
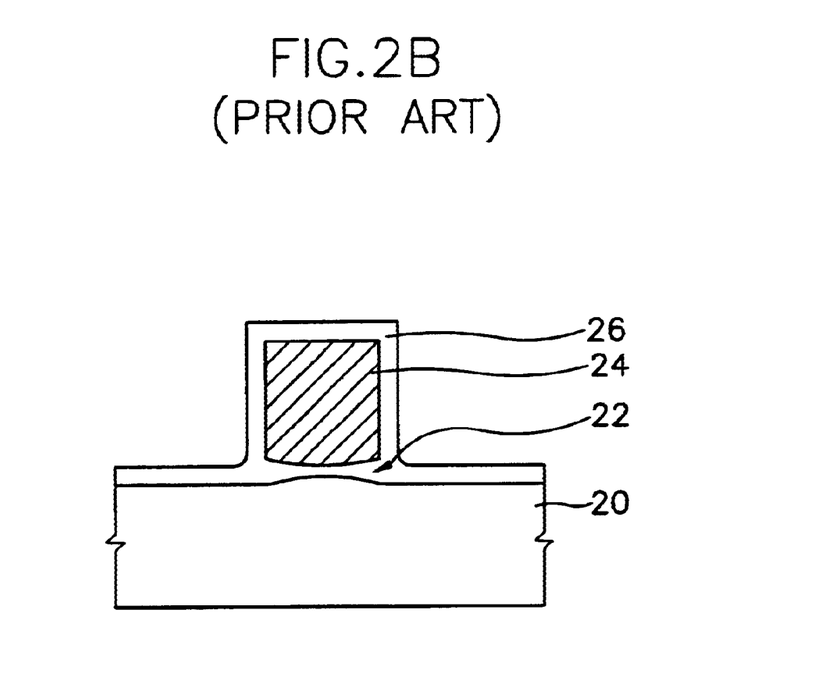

FIGS. 2A and 2B are sectional views for representing the relationship between a width of the gate electrode and a thickness of the oxide layer pattern. If the gate electrode has a wide width, the expansion of both ends of the gate oxide layer pattern caused by the Bird's Beak phenomenon is not a big problem.

That is, as shown in FIG. 2A, if the width of a gate electrode 24 is wide, the oxidant is not diffused into a center of a gate oxide layer pattern 22, so both ends of the gate oxide layer pattern 22 are only expanded. Accordingly, the thickness of the gate oxide layer pattern 22 is constantly maintained.

However, as shown in FIG. 2B, in a recent high-integrated semiconductor device having the gate electrode 24 with a width less than 0.2, the oxidant is diffused in various directions of the gate oxide layer pattern 22, so not only are both ends of the gate oxide layer pattern 22 oxidized, but also a semiconductor substrate 20 and the gate electrode 24 positioned at upper and lower portions of a center of the gate oxide layer pattern 22 are oxidized. Accordingly, the thickness of the gate oxide layer pattern 22 is increased.

Although the widths of the many cell gate electrodes forming the semiconductor memory device would be identical to each other in an ideal case, there are variations in real cases. Therefore, the oxidant is diffused into the center of the gate electrode in an area having a relatively reduced width of the gate electrode, so the thickness of the gate oxide layer pattern is increased. In addition, in an area of the gate electrode having a relatively large width of the gate electrode, the thickness of the gate oxide layer pattern is increased less than the area of the gate electrode having the relatively reduced width of the gate electrode.

Therefore, the thickness variation of the gate oxide layer pattern is treated according to the variation of the width of the gate electrode. The thickness variation of the gate oxide layer causes a variation of a threshold voltage of the gate electrode in the transistor, thereby deteriorating the reliability of the semiconductor device.

Figure 3A:
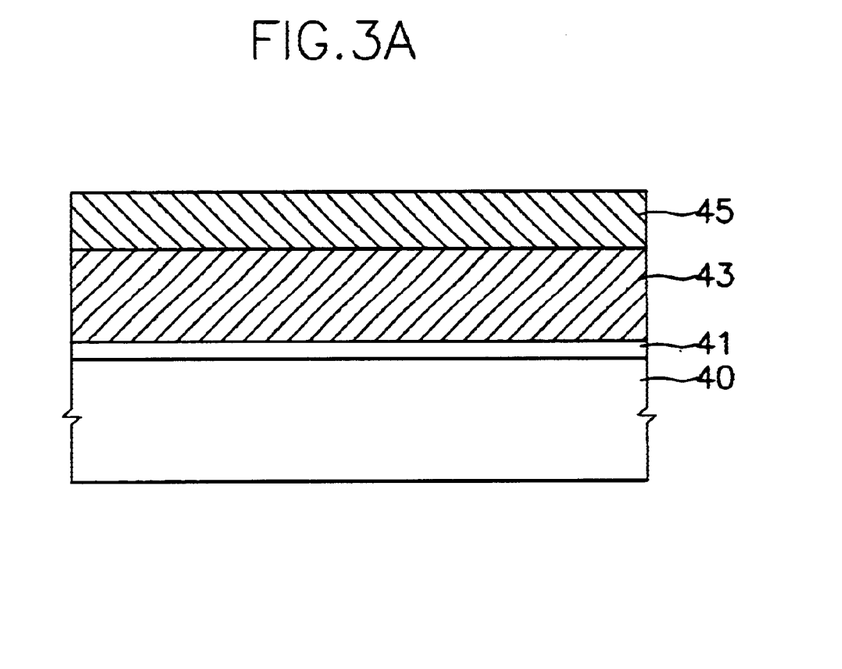
FIGS. 3A to 3C are sectional views showing a method for forming a gate electrode according to one embodiment of the present invention.
Figure 3B:
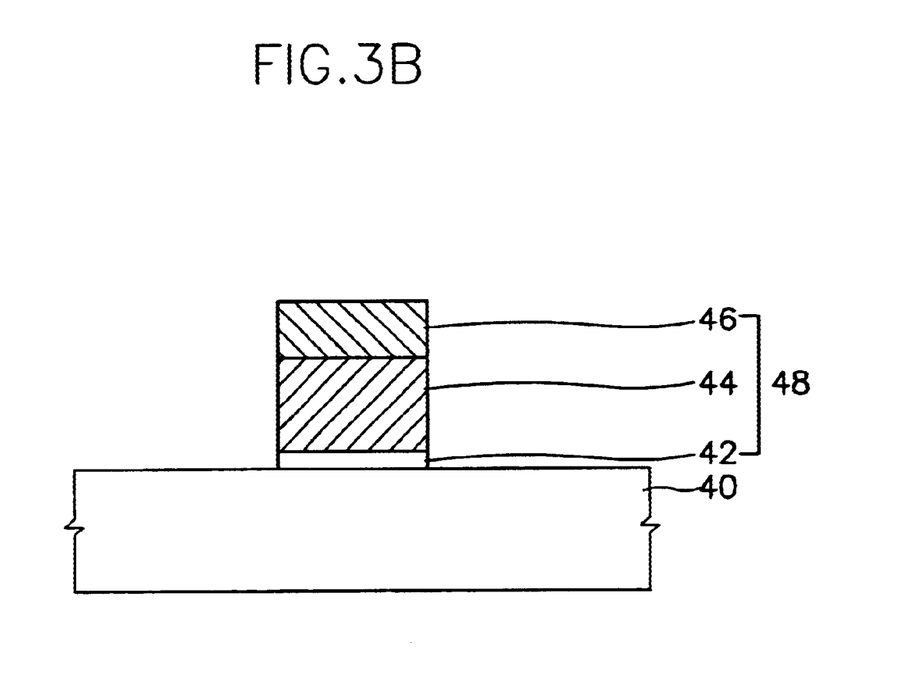
Figure 3C:
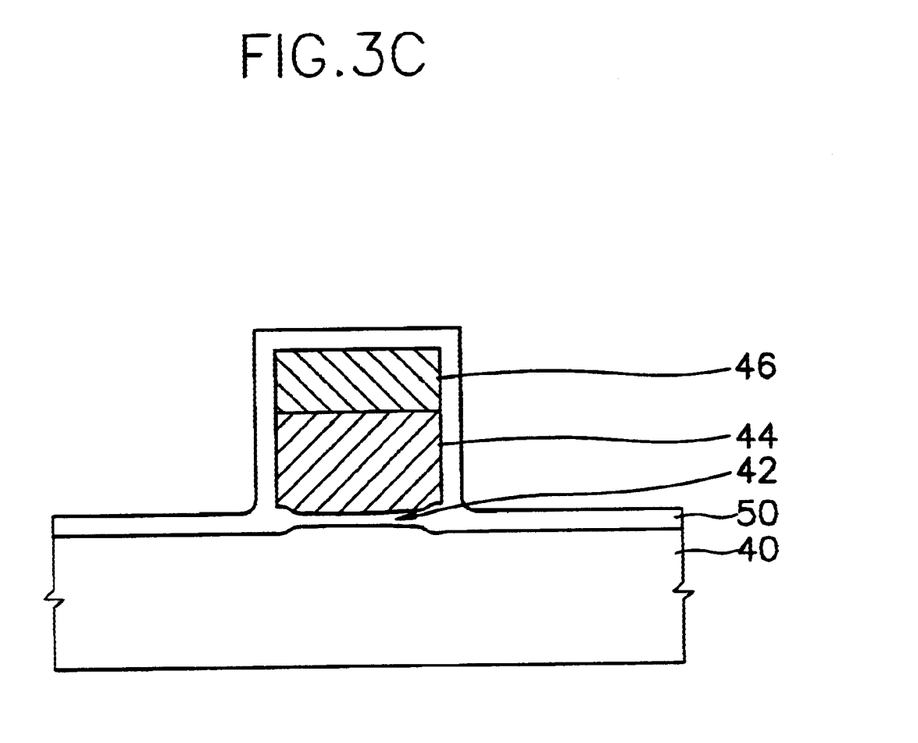

Hereinafter, preferred embodiments of the present invention will be described in detail with reference to the accompanying drawings. FIGS. 3A to 3C are sectional views showing a method for forming a gate electrode in a semiconductor device according to a first preferred embodiment of the present invention.

Referring to FIG. 3A, a semiconductor substrate 40 is defined into an active area (not shown) and a field area (not shown) through an isolation process. The field area is defined through a conventional local oxidation of silicon ("LOCOS") process or a shallow trench isolation ("STI") process.

Then, a gate oxide layer 41 having a thickness of about 50 to 200 Å is formed on the semiconductor substrate 40 through a thermal oxidation process. Thereafter, a conductive layer 43 is formed on a resulted structure formed with the gate oxide layer 41. The conductive layer 43 is formed by depositing polysilicon doped with n type or p type impurities to a thickness of about 1000 to 1500 Å. The conductive layer 43 is formed as a gate electrode through following processes.

A metal silicide layer 45, such as tungsten silicide ("WSi") layer, titanium silicide ("TiSix") layer, or tantalum silicide ("TaSix") layer, is sequentially formed on the conductive layer 43. The metal silicide layer 45 is prepared to reduce the resistance of the gate electrode.

Referring to FIG. 3B, after forming a photoresist pattern (not shown) for defining a gate electrode area on the metal silicide layer 45, predetermined portions of the metal silicide layer 45 and the conductive layer 43 are etched by using the photoresist pattern as an etching mask. Then, the photoresist pattern is removed. Plasma ashing, sulfuric acid stripping, and substrate cleaning processes are carried out for removing the photoresist pattern, so the oxide layer exposed to the semiconductor substrate 40 is almost removed, but remains in a lower portion of the conductive layer pattern. Therefore, a preliminary gate electrode 48 including a gate oxide layer pattern 42, a conductive layer pattern 44 stacked on the gate oxide layer pattern 42, and a metal silicide layer pattern 46 stacked on the conductive layer pattern 44 is formed.

Since the metal silicide layer pattern 46 is provided to reduce the resistance of the gate electrode, it can be omitted if necessary. In addition, instead of the photoresist pattern, a hard mask pattern including a nitride layer pattern, an oxide layer pattern or a composite layer pattern of the oxide layer and the nitride layer can be used as the etching mask when the etching process is carried out. That is, after forming the hard mask pattern on the metal silicide layer 45 for defining the gate electrode area, the preliminary gate electrode 48 is formed by using the hard mask pattern as the etching mask.

Referring to FIG. 3C, a re-oxidation process is carried out to form an oxide layer 50 on outer surfaces of the semiconductor substrate 40 and the preliminary gate electrode 48. The re-oxidation process is carried out to cure the damage caused by an impact of ions having high energy while an etching process for forming the preliminary gate electrode 48 is being carried out. That is, the semiconductor substrate 40 formed with the preliminary gate electrode 48 is thermally treated in an oxidation atmosphere thereby curing the damage of the semiconductor substrate 40 and the preliminary gate electrode 48.

When the re-oxidation process is carried out, the semiconductor substrate 40 formed with the preliminary gate electrode 48 is introduced into a high temperature reactor and an oxygen gas, which is an oxidant, and a chlorine-including gas for accelerating an oxidation speed are supplied into the reactor. The reactor has a temperature of about 600 to 1000° C. and a pressure of about 1 to 760 Torr.

As a result, an oxidation reaction is carried out between silicon included in the outer surface portion of the preliminary gate electrode 48 and in the upper surface portion of the semiconductor substrate 40 and the oxygen gas, so that an oxide layer is formed at the outer surface of the preliminary gate electrode 48 and on the semiconductor substrate 40. At this time, the oxide layer 50 formed on the semiconductor substrate 40 and on the outer surface of the preliminary gate electrode 48 by the re-oxidation process has a thickness of about 50 to 200 Å.

The oxidant penetrates into each lateral portion of the gate oxide layer pattern 42 and is diffused into a center of the gate oxide layer pattern 42. The penetrated oxidant is reacted with silicon included in the surface portion of the semiconductor substrate 40 positioned below the gate oxide layer pattern 42 and included in the conductive pattern 44 formed on the gate oxide layer pattern, thereby forming the oxide layer 50. Accordingly, both ends of the gate oxide layer pattern 42 are expanded and a bottom peripheral portion of the conductive layer pattern 44 is bent, which is called "Bird's Beak phenomenon". It is preferred that only both ends of the gate oxide layer pattern 42 are expanded by the Bird's Beak phenomenon. However, since the recently developed gate electrode has a fine width less than 0.2, the whole thickness of the gate oxide layer pattern 42 is increased due to the Bird's Beak phenomenon. Therefore, it is required to restrain the thickness of the gate oxide layer pattern 42 from being increased by reducing a length of the Bird's Beak.

In order to maximally restrain the increase of the thickness of the gate oxide layer pattern 42, the chlorine-including gas is supplied into the reactor together with the oxygen gas acting as the oxidant when the re-oxidation process is carried out. As a result, the reaction speed between the oxidant and silicon is accelerated. Thus, the oxidant is prevented from being diffused toward the center of the gate oxide layer pattern 42, so that the increase of the whole thickness of the gate oxide layer pattern 42 is minimized.

At this time, though the chlorine-including gas is simultaneously supplied together with the oxygen gas, it is also possible to supply the chlorine-including gas together with the oxygen gas after supplying the chlorine-including gas into the reactor. In detail, the chlorine-including gas can be supplied into the reactor within 10 minutes before the oxygen gas is supplied into the reactor.

Hereinafter, the relationship between the length of the Bird's Beak and the reaction speed of silicon with the oxidant when the re-oxidation process is carried out will be described. Firstly, when the re-oxidation process is carried out with respect to the semiconductor substrate 40 formed with the preliminary gate electrode 48, if the reaction speed between silicon and the oxidant is slow, the remaining oxidant, which is not reacted with silicon, is penetrated into a lateral side of the gate oxide layer pattern 42 and diffused therefrom. In addition, as the reaction speed between silicon and the oxidant becomes slow, the oxidant is diffused toward the center of the gate oxide layer pattern and reacted with silicon included in the semiconductor substrate 40 positioned below the gate oxide layer pattern 42a and included in the conductive layer pattern 44, thereby forming the oxide layer, which increases the length of the Bird's Beak.

In addition, if the reaction speed between silicon and the oxidant is fast when the re-oxidation process is carried out, the oxidant is rapidly reacted with silicon formed at the exposed surface portions of the semiconductor substrate and the conductive layer pattern 44, so the oxidant is not diffused toward the center of the gate oxide layer pattern 42. Therefore, the Bird's Beak is partially formed only at both ends of the gate oxide layer pattern 42 and at the bottom peripheral portion of the conductive layer pattern 44.

If the chlorine-including gas is supplied together with the oxygen gas acting as the oxidant, the reaction speed between the oxygen gas and silicon is more accelerated due to the presence of the chlorine-including gas. Therefore, by supplying the chlorine-including gas, the length of the Bird's Beak formed in the gate oxide layer pattern 42 can be reduced, so the increase of the thickness of the gate oxide layer pattern 42 is minimized. The chlorine-including gas may comprise HCl, $Cl_2$ and/or $C_2HCl_3$ gases.

In addition, if the oxide layer is formed by supplying the oxygen gas together with the chlorine-including gas, the oxide layer forming speed is shown differently between a case where the oxide layer is previously formed by a predetermined thickness and another case where layers including silicon are formed without having any layers thereon. Accordingly, it is possible to minimize the increase of the whole thickness of the gate oxide layer pattern 42.

In detail, in a case where the oxide layer is formed on the semiconductor substrate having an exposed layer including silicon through the thermal oxidation process, the oxide layer is rapidly formed as compared with a case in which the oxide layer is formed on the semiconductor substrate having a layer including silicon formed with an oxide layer having a predetermined thickness. According to known information, under the same conditions, the oxide layer forming speed is faster by about two or three times when the oxidation process is carried out in a silicon substrate without having any layers or patterns thereon as compared with when the oxidation process is carried out on a silicon substrate formed with an oxide layer having a thickness of about 15 Å.

If the oxide layer is formed by supplying only the oxygen gas without using the chlorine-including gas, the oxide layer forming speed when the oxide layer is previously formed on the layer including silicon is substantially the same as the oxide layer forming speed when the layer including silicon has no layers or patterns thereon.

Accordingly, when the re-oxidation process is carried out using a chlorine-including gas together with an oxygen gas, silicon included in the exposed semiconductor substrate 40, the conductive pattern 44 and the metal silicide layer pattern are rapidly reacted with the oxygen gas. However, silicon included in the semiconductor substrate 40 positioned below the gate oxide layer pattern 42*a* and in the conductive layer pattern 44 formed on the gate oxide layer pattern 42*a* is reacted with the oxygen gas at a relatively low speed. Accordingly, the length of the Bird's Beak penetrating into the gate oxide layer pattern 42*a* is reduced and the increase in the thickness of the gate oxide layer pattern 42*a* is minimized.

At this time, the chlorine-including gas is supplied by about 0.1 to 10 percent by volume with respect to the oxygen gas. In order to minimize the increase in the thickness of the gate oxide layer and to obtain a stable result, the flow rate of chlorine-including gas is preferably 1.0 percent by volume with respect to the flow rate of the oxygen gas.

If the re-oxidation process is carried out at a temperature of about 600 to 1000° C., and under the pressure about 1 to 760 Torr while supplying the oxygen gas and 1 volume percent of an HCl gas into the reactor, the oxidation speed is increased about 1.5 to 2.5 times as compared with when the oxygen gas only is supplied into the reactor. That is, the time required for forming the oxide layer having a predetermined thickness is reduced by 30 to 60 percent as compared with the time required for forming the oxide layer by supplying only the oxygen gas.

Figure 4:
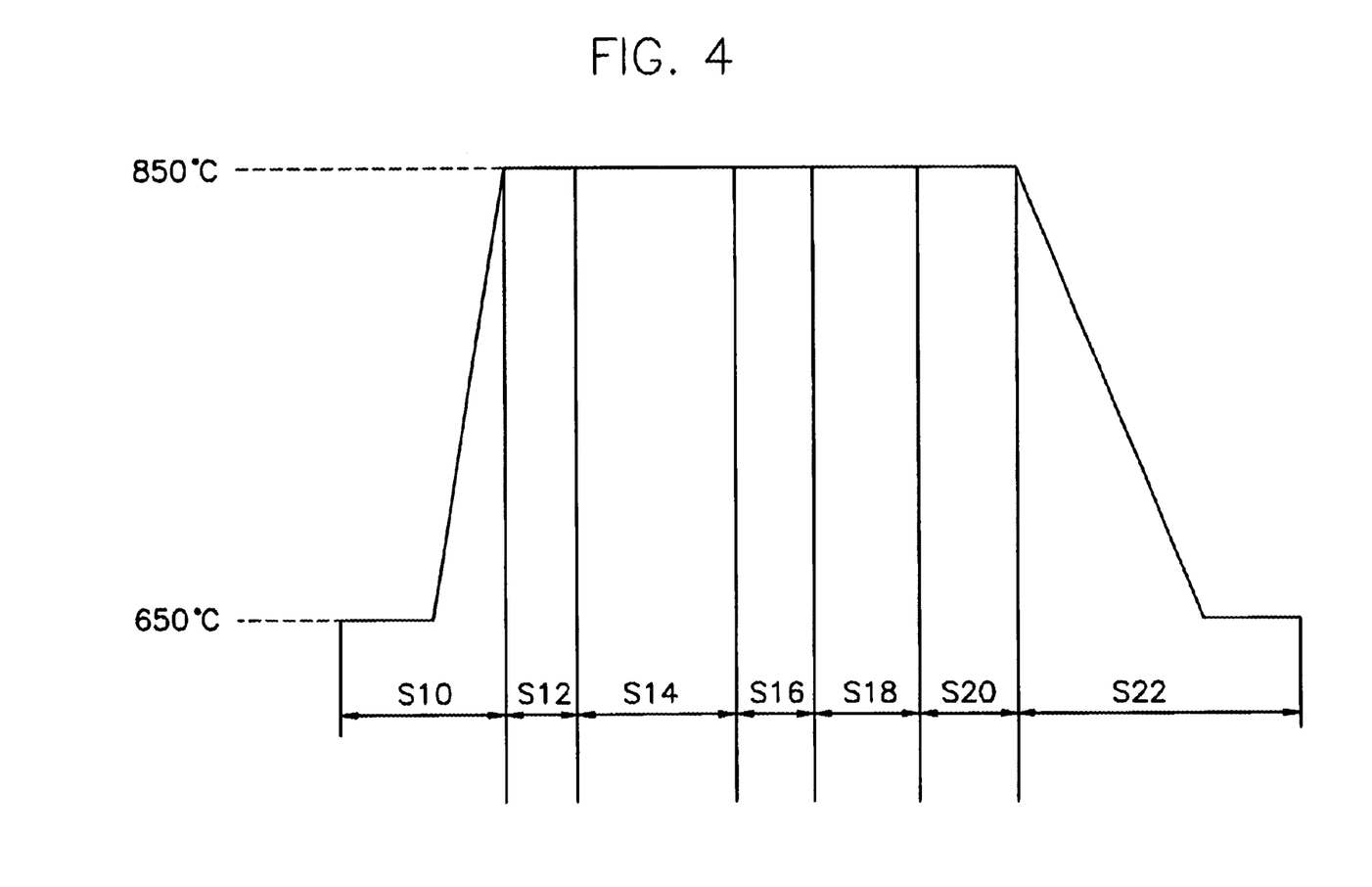
FIG. 4 is a view showing a process timing of a re-oxidation process according to one embodiment of the present invention.

FIG. 4 is a view showing an example of a process timing for the re-oxidation process according one embodiment of the present invention. Referring to FIG. 4, the semiconductor substrate formed with the preliminary gate electrode is introduced into the reactor having the temperature about 600 to 700° C. At this time, a nitrogen gas of 10 to 30 slm is supplied into the reactor. The nitrogen gas prevents the surface of the semiconductor substrate introduced into the reactor from being oxidized. Then, the temperature of the reactor is increased by 10 to 15 per a minute until the internal temperature of the reactor reaches the temperature about 800 to 850° C. (step S10).

At the temperature of 800 to 850° C., the nitrogen gas is continuously supplied into the reactor for 10 to 15 minutes (step S12). The above temperature is an initial temperature provided for performing the thermal oxidation process. By maintaining the above temperature for 10 to 15 minutes, the temperature variation in the reactor is reduced.

Then, after stopping the nitrogen gas to be supplied, the oxygen gas and the chlorine-including gas are supplied into the reactor for a predetermined time to form the oxide layer having a desired thickness (step S14). At this time, the oxygen gas of 10 to 15 slm is supplied, and the chlorine-including gas is supplied by 0.1 to 10 percent by volume with respect to the flow amount of the oxygen gas.

At this time, the chlorine-including gas is simultaneously supplied together with the oxygen gas. However, it is also possible to previously supply the chlorine-including gas before the oxygen gas is supplied. In detail, the chlorine-including gas is previously supplied in the reactor for 10 minutes before the oxygen gas is supplied into the reactor. That is, after supplying the chlorine-including gas together with the nitrogen gas, the oxygen gas is continuously supplied so as to form the oxide layer by means of the oxygen gas and the chlorine-including gas.

When the oxide layer has been formed, the nitrogen gas of 10 to 30 slm is supplied for 10 to 15 minutes (step S16). Then, after stopping the supply of the nitrogen gas, an $N_2O$ gas of 10 to 30 slm is supplied for 10 to 15 minutes (step S18). In addition, after stopping the supply of the $N_2O$ gas, the nitrogen gas of 10 to 30 slm is supplied for 10 to 15 minutes (S20). The above processes are thermal treating processes for improving the characteristic of the oxide layer.

When the above processes have been finished, the temperature in the reactor is adjusted to 650° C. by decreasing the temperature of the reactor by 3 to 5° C. per a minute while continuously supplying the nitrogen gas of 10 to 30 slm (step S22). By supplying the nitrogen gas into the reactor, the semiconductor substrate is prevented from being oxidized, so that an undesired oxide layer is not formed on the semiconductor substrate.

When the temperature in the reactor maintains at 650° C., the semiconductor substrate is withdrawn from the reactor while continuously supplying the nitrogen gas.

Accordingly, by supplying the chlorine-including gas together with the oxygen gas acting as an oxidant during the re-oxidation process, the increase in the thickness of the gate oxide layer is minimized and the time required for performing the re-oxidation process is shortened. Therefore, the variation of the thickness of the gate oxide layer is not generated in a gate electrode forming each cell of the semiconductor device, so the gate electrode forming each cell have a uniform threshold voltage, thereby improving the reliability of the semiconductor device.

Figure 5A:
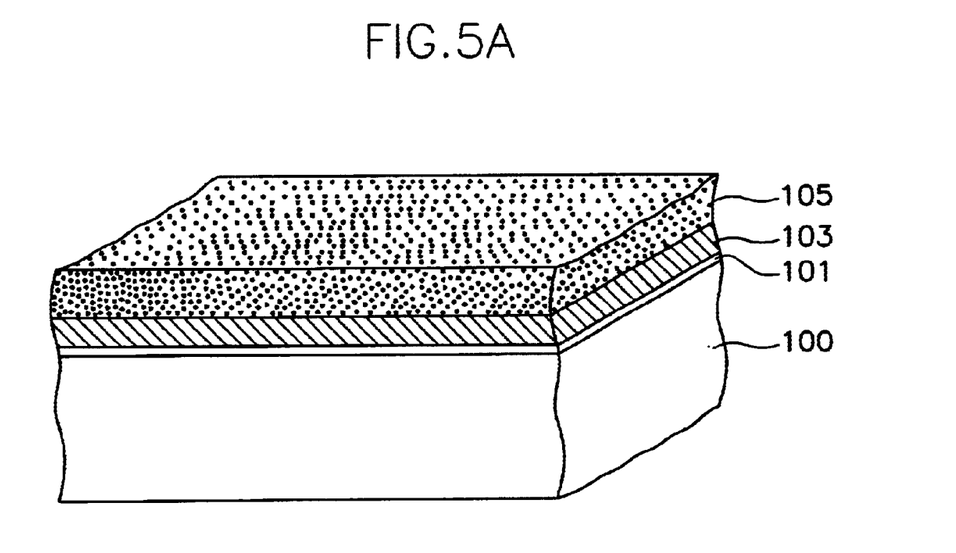
FIGS. 5A to 5H are sectional views showing a method for forming a cell gate electrode in a non-volatile memory device according to one embodiment of the present invention.

FIGS. 5A to 5H are sectional views showing a method for forming a cell gate electrode in a not-volatile memory device according to the second embodiment of the present invention. Referring to FIG. 5A, a tunnel oxide layer 101 of a cell transistor is formed by shallowly growing an oxide layer less than 100 Å on a semiconductor substrate 100. Then, a first silicon layer 103 used for a floating gate is formed on the tunnel oxide layer 101 by a thickness about 300 to 1000 Å through a low-pressure chemical vapor deposition ("LPCVD") process. After that, the first silicon layer 103 is doped with high-density N type impurities through a conventional doping process, such as a $POCl_3$ diffusing process, an ion implantation process, or an in-situ doping process.

Then, a nitride layer 105 is deposited on the first silicon layer 103 to a thickness about 1500 to 2000 Å through the low-pressure chemical vapor deposition (LPCVD) process. The nitride layer 105 acts as a stopping layer when a following chemical mechanical polishing ("CMP") process is carried out.

Figure 5B:
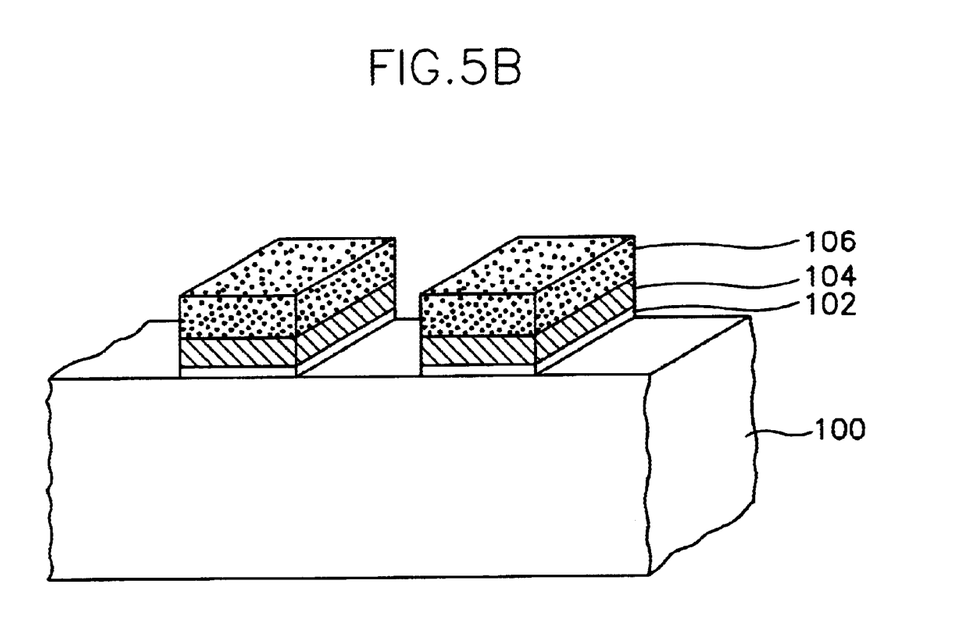

Referring to FIG. 5B, after forming an etching mask for defining the floating gate, predetermined portions of the nitride layer 105, the first silicon layer 103, and the oxide layer are dry-etched, thereby forming a stack structure of an oxide layer pattern 102, a first silicon layer pattern 104 and a nitride layer pattern 106.

Figure 5C:
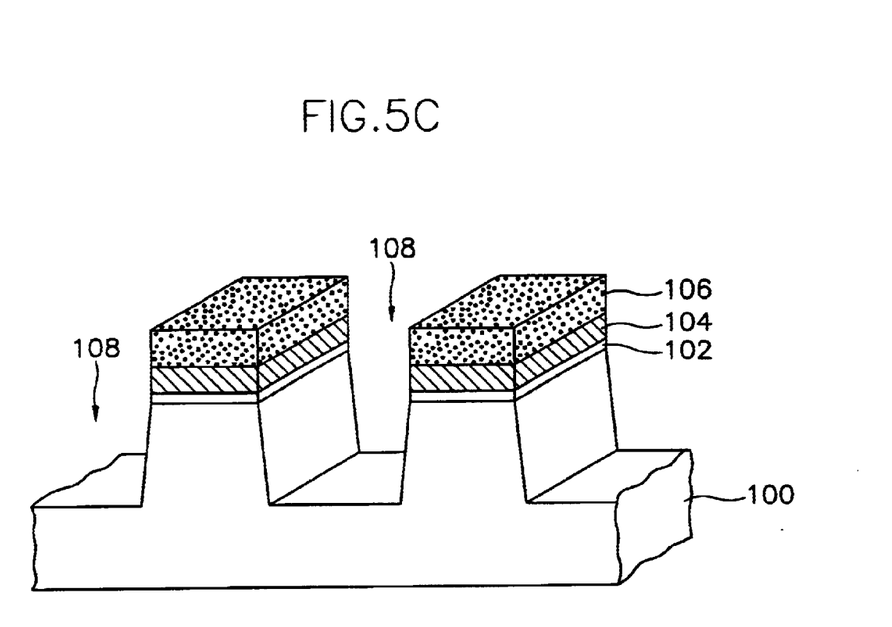

Referring to FIG. 5C, a trench 108 is formed by etching an upper portion of the semiconductor substrate by a depth about 2000 to 5000 Å using the stacked structure as an etching mask. As a result, the first silicon layer patterns 104 are divided by the trench 108. Accordingly, by the trench 108, an active area and the floating gate are simultaneously defined.

Figure 5D:
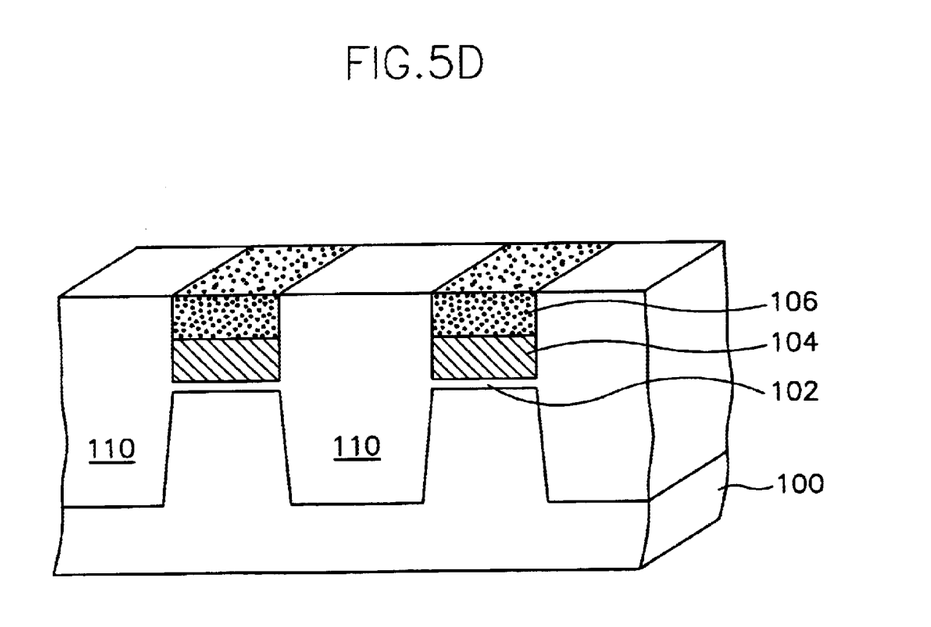

Referring to FIG. 5D, an oxide layer having a superior gap fill characteristic, such as USG or TEOS, is deposited to a thickness of 5000 Å through the CVD process to fill the trench 108. Otherwise, an HDP oxide layer is formed to fill the trench 108 by generating high-density plasma ("HDP") using $SiH_4$, $O_2$, and Ar gases as a plasma source.

When the oxide layer is filled in the trench 108, the oxide layer is removed through an etch back or the CMP process until the upper surface of the nitride layer pattern is exposed, thereby forming a field oxide layer 110 in the trench 108.

Figure 5E:
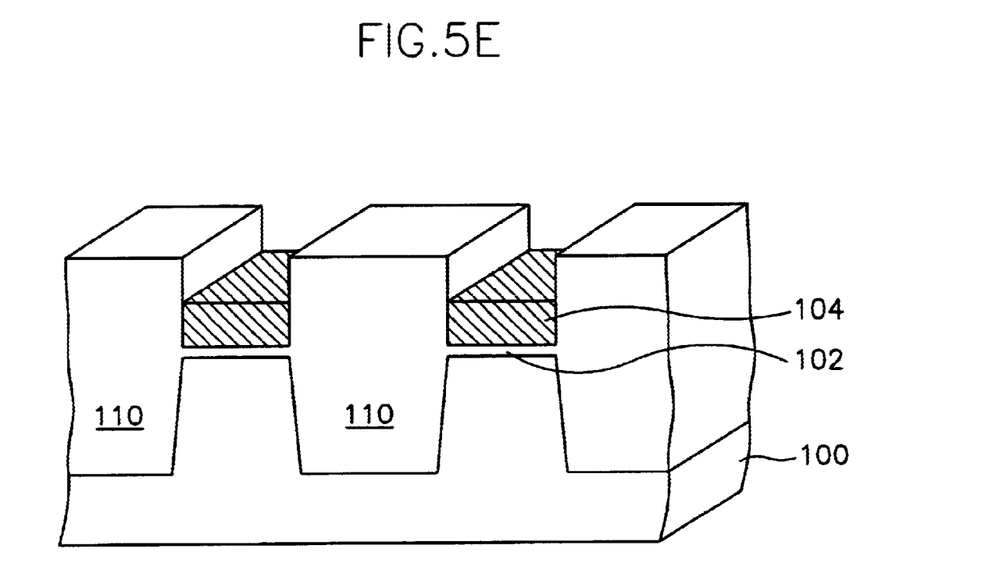

Referring to FIG. 5E, the first silicon layer pattern 104 is exposed by removing the nitride layer pattern 106 through a phosphoric acid stripping process. Then, a pre-cleaning process is carried out with respect to the semiconductor substrate for 30 seconds by using etchant containing hydrofluoric acid. Due to the stripping process of the nitride layer pattern 106 and the pre-cleaning process of the semiconductor substrate, the field oxide layer 110 is consumed by a thickness more than 250 Å.

Figure 5F:
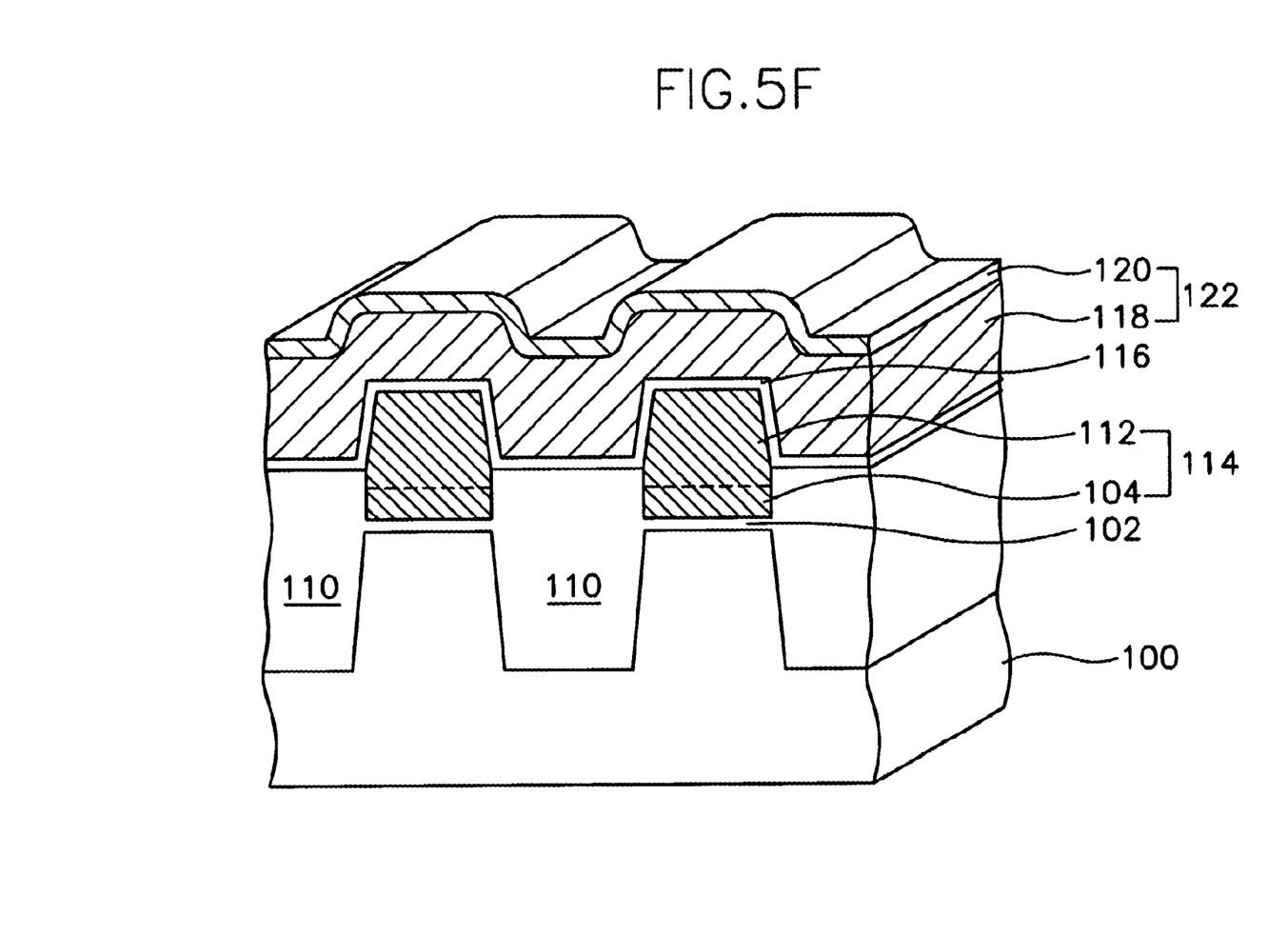

Referring to FIG. 5F, a second silicon layer, such as polysilicon or amorphous silicon, is deposited on the first silicon layer pattern 104 and the field oxide layer 110 to a thickness more than 3000 Å through the LPCVD process, such that the second silicon layer electrically makes contact with the first silicon layer pattern 104. Then, the second silicon layer is doped with high-density N type impurities through a conventional doping process, such as a $POCl_3$ diffusing process, an ion implantation process, or an in-situ doping process. The second silicon layer is provided to enlarge a surface area of an dielectric interlayer, which is formed through a following process, so it is preferred to form the second silicon layer to be thick, as possible.

After that, a second silicon layer pattern 112 is formed by removing a predetermined portion of the second silicon layer positioned on the field oxide layer 110 through conventional photolithography processes. As a result, floating gates of adjacent cells are separated from each other.

Then, an ONO dielectric interlayer 116 is formed on the entire surface of the resulted structure. For example, a first oxide layer having a thickness of 100 Å is grown by oxidizing the second silicon layer pattern 112. Then, a nitride layer having a thickness of 130 Å is deposited on the first oxide layer. After that, a second oxide layer having a thickness of 40 Å is grown by oxidizing the nitride layer, thereby forming the dielectric interlayer 116, in which an equivalent oxide layer thickness is 100 to 200 Å.

Then, a control gate 122 is formed on the dielectric interlayer 116. The control gate 122 includes a polysilicon layer doped in an $N^+$ type and a metal silicide layer, such as tungsten silicide (WSi) layer, titanium silicide (TiSix) layer, and tantalum silicide (TaSix) layer, which is stacked on the polysilicon layer. Preferably, the polysilicon layer 118 of the control gate 122 has a thickness of about 1000 Å, and the metal silicide layer 120 has a thickness of about 1000 to 1500 Å.

Figure 5G:
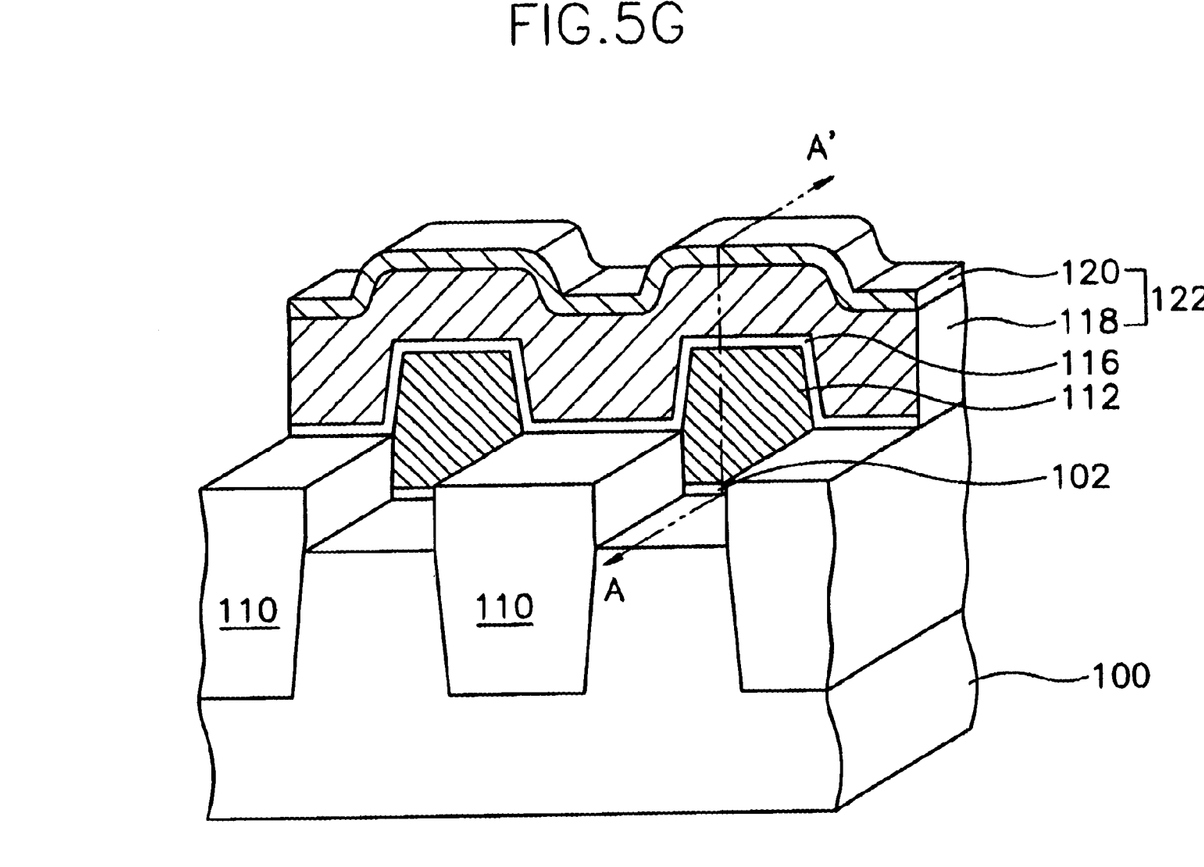
Figure 6A:
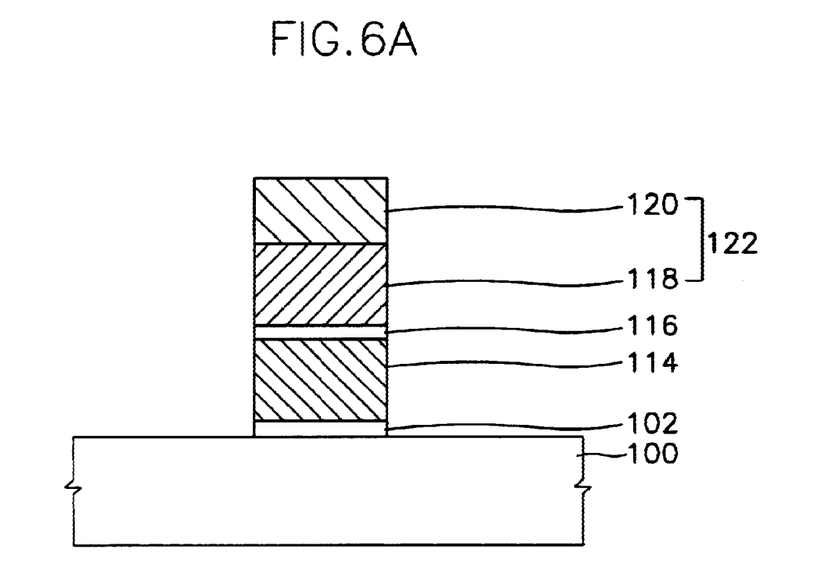
FIGS. 6A and 6B are sectional views taken by cutting away predetermined portions of FIGS. 5G and 5H.

Referring to FIG. 5G, after patterning the control gate 122 through a photolithography process, the dielectric interlayer 116, the second silicon layer pattern 112 and the first silicon layer pattern 104 are sequentially dry-etched. As a result, a stack type preliminary cell gate electrode having the floating gate 114 including the first and second silicon layer patterns 104 and 112 and the control gate 122 is formed in a memory cell area. FIG. 6A is a sectional view taken along the line A–A' in FIG. 5G.

Figure 5H:
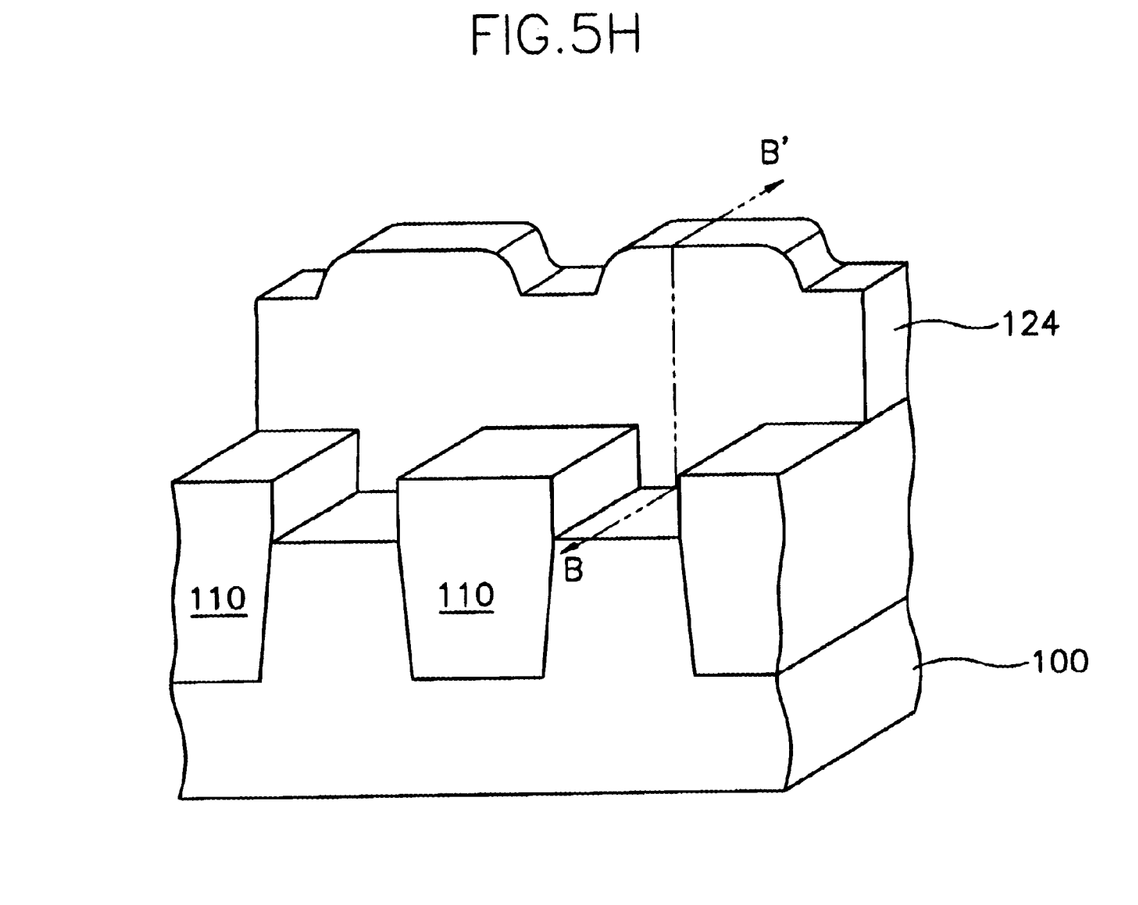
Figure 6B:
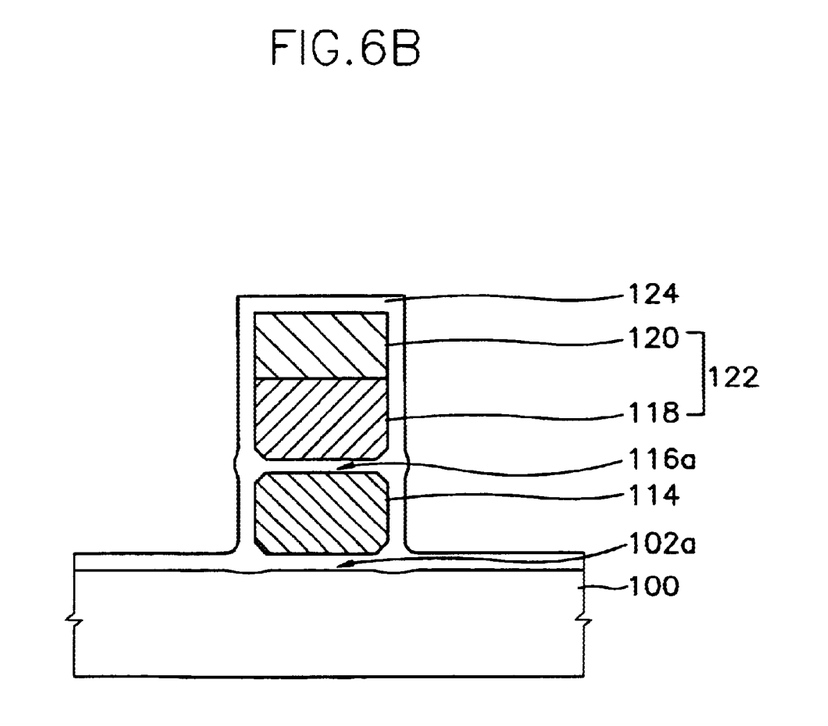

Referring to FIG. 5H, an oxide layer 124 is formed on upper surfaces of the exposed semiconductor substrate 100 and the preliminary cell gate electrode by performing the re-oxidation process with respect to the semiconductor substrate formed with the preliminary cell gate electrode. As mentioned above, the re-oxidation process is carried out to cure the damage caused by an impact of ions having high energy while an etching process for forming the preliminary cell gate electrode is being carried out. FIG. 6B is a section view taken along the line B–B' in FIG. 5H.

When the re-oxidation process is carried out, the semiconductor substrate 100 formed with the preliminary cell gate electrode is introduced into a high temperature reactor and an oxygen gas, which is an oxidant, and a chlorine-including gas for accelerating an oxidation speed are supplied into the reactor. At this time, the reactor has a temperature of about 600 to 1000° C. and a pressure of about 1 to 760 Torr. In addition, the chlorine-including gas is supplied by 0.1 to 10 volume percent with respect to the flow amount of the oxygen gas. As a result, an oxidation reaction is carried out between silicon included in the outer surface portion of the preliminary cell gate electrode and in the surface portion of the semiconductor substrate and the oxygen gas, so that the oxide layer 124 is formed on the outer surface of the preliminary cell gate electrode and on the semiconductor substrate 100. At this time, the oxide layer 124 formed on the outer surface of the preliminary cell gate electrode and on the semiconductor substrate by the re-oxidation process has a thickness of about 50 to 200 Å.

When the semiconductor substrate 100 including the cell gate electrode is oxidized through above-described method, the oxidant is diffused into lateral portions of the tunnel oxide layer pattern 102a and the dielectric interlayer pattern 116a. That is, the oxidant diffused into the tunnel oxide layer pattern 102a is reacted with silicon included in the semiconductor substrate 100 positioned below the tunnel oxide layer pattern 102a and included in the floating gate 114 formed on the tunnel oxide layer pattern 102a, thereby forming the oxide layer. Therefore, both ends of the tunnel oxide layer pattern are expanded and a bottom peripheral portion of the floating gate 114 is bent, which is called as "Bird's Beak phenomenon".

In addition, the oxidant diffused into the dielectric interlayer pattern 116a is reacted with silicon included in the floating gate 114 positioned below the dielectric interlayer pattern 116a and in the control gate formed on the dielectric interlayer pattern 116a, thereby forming the oxide layer 124. Thus, both ends of the first and second oxide layers forming the dielectric interlayer pattern 116a are expanded and an upper peripheral portion of the floating gate 114 and a bottom peripheral portion of the control gate 122 are bent, which is called as "Bird's Beak phenomenon".

However, as mentioned above, since the re-oxidation process is carried out by using the chlorine-including gas together with the oxygen gas, the reaction speed of the oxidant with respect to the silicon is increased so that the oxidant is prevented from being diffused toward the center portions of the gate oxide layer pattern 102a and the dielectric interlayer pattern 116a. In addition, when the chlorine-including gas is used together with the oxygen gas for forming the oxide layer, the oxide layer is rapidly formed if the layer including silicon has no layers or patterns thereon, other than the layer has an oxide layer thereon. Therefore, if the re-oxidation process is carried out by using the chlorine-including gas together with the oxygen gas, the oxidant is rapidly reacted with silicon included in the outer surfaces of the exposed semiconductor substrate 100 and in the preliminary cell gate electrode. However, the oxidant is reacted at a relatively low speed with silicon included in the semiconductor substrate positioned below the tunnel oxide layer pattern 102a and included in the floating gate 114 formed on the tunnel oxide layer. In addition, silicon included in the floating gate 114 positioned below the dielectric interlayer pattern 116a and in the control gate 122 formed on the dielectric interlayer pattern 116a is reacted with the oxygen gas at a low speed. The chlorine-including gas may be HCl, $Cl_2$ or $C_2HCl_3$ gas.

Accordingly, the length of the Bird's Beak formed in the tunnel oxide layer pattern 102a and in the dielectric interlayer pattern 116a is reduced, so that it is possible to minimize the increase in the thickness of the tunnel oxide layer pattern 102a and the dielectric interlayer 116a.

Since the non-volatile memory device momentarily stores and erases data, each cell is required to have a uniform voltage for store and erase data. For this reason, the characteristic of each cell gate has to be uniformed formed. However, in the cell gate electrode formed through the above-mentioned processes, the thickness variation of the tunnel oxide layer pattern and the dielectric interlayer is remarkably reduced so that the variation of the threshold voltage between cell gates is also reduced. In addition, time required for performing the re-oxidation process is reduced. Accordingly, the reliability and productivity of the semiconductor device are improved.

Hereinafter, the thickness variations of the gate insulating patterns obtained after performing the re-oxidation process according to a conventional method and the method of the present invention, respectively, will be described by comparing with each other.

In detail, after performing the re-oxidation process by using an oxygen gas, which was an oxidant, together with an HCl gas, the thickness of each gate insulating layer pattern was measured. In addition, after performing the re-oxidation process by using only the oxygen gas, the thickness of each gate insulating layer pattern was measured. The re-oxidation processes were carried out under each process condition to form an insulating layer having a thickness of 100 Å on a planar semiconductor substrate without having any patterns thereon. In addition, the thickness of each layer forming each preliminary gate electrode, which was previously formed before the re-oxidation processes were carried out, was uniformly formed.

When the oxygen gas was used together with the HCl gas, the thickness of both sides of the gate oxide layer pattern was measured to 97 Å and 92 Å, respectively, and the thickness of a center portion thereof was measured to 65 Å. On the contrary, when the oxygen gas was only used, the thickness of both sides of the gate oxide layer pattern was measured to 99 Å and 104 Å, respectively, and the thickness of a center portion thereof was measured to 78 Å.

That is, when the re-oxidation processes were carried out on the planar semiconductor substrate under each process condition to form the insulating layer having the same thickness, the conventional method increased the thickness of both sides and the center of the gate oxide layer pattern, because the Bird's Beak was lengthened into the gate oxide layer pattern. In detail, when the oxygen gas was used together with the HCl gas, the thickness of the gate oxide layer pattern became reduced about 12 to 20 percent as compared with the thickness of the gate oxide layer pattern formed by using only the oxygen gas. Therefore, by performing the re-oxidation process with adding the chlorine-including gas, the thickness of the gate oxide layer was restrained from being increased.

As mentioned above, according to the present invention, the re-oxidation process is carried out by supplying chlorine-including gas together with the oxygen gas acting as the oxidant for forming the gate electrode, so the thickness increase of the gate oxide layer caused by the Bird's Beak phenomenon can be restrained and the process time can be reduced. Therefore, the characteristic variation of the cell is reduced, so the reliability of the semiconductor device is improved.

These and other features and advantages of the present disclosure may be readily ascertained by one of ordinary skill in the pertinent art based on the teachings herein. It is to be understood that the teachings of the present disclosure may be implemented in various forms of hardware, software, firmware, special purpose processors, or combinations thereof.

While the present invention has been described in detail with reference to preferred embodiments thereof, it shall be understood by those of ordinary skill in the pertinent art that various changes, substitutions and alterations may be made thereto without departing from the scope or spirit of the invention as defined by the appended claims.

What is claimed is:

1. A method for forming a cell gate electrode in a non-volatile semiconductor device, the method comprising the steps of:

i) forming a preliminary cell gate electrode on a semiconductor substrate, the preliminary cell gate electrode including a tunnel oxide layer pattern, a first conductive layer pattern stacked on the tunnel oxide layer pattern, an dielectric interlayer pattern stacked on the first conductive layer pattern, and a second conductive layer pattern stacked on the dielectric interlayer pattern; and ii) performing a re-oxidation process for forming an oxide layer on an outer surface of the preliminary cell gate electrode and on the semiconductor substrate by supplying an oxygen gas and a chlorine-including gas while restraining a thickness of the tunnel oxide layer pattern and the dielectric interlayer pattern from being increased.

2. The method as claimed in claim 1, wherein, when the re-oxidation process is carried out, the chlorine-including gas is supplied by about 0.1 to 10 percent by volume with respect to the oxygen gas.

3. The method as claimed in claim 1, wherein the re-oxidation process is carried out at a temperature range of about 600 to 1000° C., and under a pressure range of about 1 to 760 Torr.

4. The method as claimed in claim 1, wherein, when the re-oxidation process is carried out, the chlorine-including gas and the oxygen gas are simultaneously supplied.

5. The method as claimed in claim 1, wherein, when the re-oxidation process is carried out, the oxygen gas is supplied after the chlorine-including gas is supplied.

6. The method as claimed in claim 1, wherein the chlorine-including gas is any one selected from the group consisting of HCl, Cl2 and C2HCl3 gases.

7. A method for forming a cell gate electrode in a non-volatile semiconductor device, the method comprising the steps of:

i) forming a stacked structure of a tunnel oxide layer pattern, a first silicon layer pattern for a floating gate, and a nitride layer pattern on a semiconductor substrate;

ii) forming a trench by etching the semiconductor substrate using the stacked structure as an etching mask;

iii) forming a field oxide layer for burying the trench;

iv) sequentially forming a dielectric interlayer and a second silicon layer pattern for a control gate on the first silicon layer pattern;

v) forming a preliminary cell gate electrode having a stacked structure of the tunnel oxide layer pattern, the first silicon layer pattern, an dielectric interlayer pattern, and the second silicon layer pattern by etching predetermined portions of the control gate and the dielectric interlayer; and vi) performing a re-oxidation process for forming an oxide layer on an outer surface of the preliminary cell gate electrode and the semiconductor substrate by supplying an oxygen gas and a chlorine-including gas onto the semiconductor substrate including the preliminary cell gate electrode while restraining a thickness of the tunnel oxide layer pattern and the dielectric interlayer pattern from being increased.

8. The method as claimed in claim 7, wherein, when the re-oxidation process is carried out, the chlorine-including gas is supplied by 0.1 to 10 percent by volume with respect to the oxygen gas.

9. The method as claimed in claim 7, wherein the re-oxidation process is carried out at a temperature range about 600 to 1000° C., and under a pressure range about 1 to 760 Torr.

10. The method as claimed in claim 7, wherein the chlorine-including gas is any one selected from the group consisting of HCl, Cl2 and C2HCl3 gases.

* * * * *